United States Patent
Tews et al.

(10) Patent No.: US 8,758,634 B2
(45) Date of Patent: Jun. 24, 2014

(54) COMPOSITION AND METHOD FOR MICRO ETCHING OF COPPER AND COPPER ALLOYS

(75) Inventors: Dirk Tews, Berlin (DE); Christian Sparing, Berlin (DE); Martin Thoms, Berlin (DE)

(73) Assignee: Atotech Deutschland GmbH, Berlin (DE)

(*) Notice: Subject to any disclaimer, the term of this patent is extended or adjusted under 35 U.S.C. 154(b) by 0 days.

(21) Appl. No.: 13/634,913

(22) PCT Filed: May 26, 2010

(86) PCT No.: PCT/EP2010/057243
§ 371 (c)(1),
(2), (4) Date: Sep. 14, 2012

(87) PCT Pub. No.: WO2011/147448
PCT Pub. Date: Dec. 1, 2011

(65) Prior Publication Data
US 2013/0056438 A1    Mar. 7, 2013

(51) Int. Cl.
*H01B 13/00*    (2006.01)

(52) U.S. Cl.
USPC ............ 216/13; 216/105; 216/106; 252/79.1; 252/79.2; 252/79.3; 252/79.4

(58) Field of Classification Search
USPC ............... 216/13, 105, 106; 252/79.1–79.4
See application file for complete search history.

(56) References Cited

U.S. PATENT DOCUMENTS

| | | |
|---|---|---|
| 3,645,772 A | 2/1972 | Jones |
| 5,435,860 A | 7/1995 | Maki et al. |
| 5,807,493 A | 9/1998 | Maki et al. |
| 6,562,149 B1 | 5/2003 | Grieser et al. |
| 7,189,336 B2 * | 3/2007 | Morikawa et al. ............ 216/106 |
| 7,563,315 B2 | 7/2009 | Bernards et al. |
| 8,192,636 B2 * | 6/2012 | Tews et al. ...................... 216/13 |
| 2006/0199394 A1 | 9/2006 | Takahashi et al. |
| 2006/0226115 A1 * | 10/2006 | Bernards et al. ................ 216/13 |
| 2010/0323099 A1 | 12/2010 | Sparing et al. |

FOREIGN PATENT DOCUMENTS

| | | |
|---|---|---|
| CN | 1249360 | 4/2000 |
| CN | 101381873 | 3/2009 |
| DE | 102008045306 | 3/2009 |
| EP | 1643817 | 4/2006 |
| EP | 2099268 | 9/2009 |
| EP | 2241653 | 10/2010 |
| JP | 2006111933 | 4/2006 |

OTHER PUBLICATIONS

PCT/EP2010/057243; PCT International Search Report and Written Opinion of the International Searching Authority dated Feb. 16, 2011.
Official Action for Chinese Patent Application No. 201080065730.X dated Feb. 8, 2014.

* cited by examiner

*Primary Examiner* — Nadine Norton
*Assistant Examiner* — Maki Angadi
(74) *Attorney, Agent, or Firm* — Renner, Otto, Boisselle & Sklar, LLP

(57) ABSTRACT

Disclosed is a composition for and applying said method for micro etching of copper or copper alloys during manufacture of printed circuit boards. Said composition comprises a copper salt, a source of halide ions, a buffer system and a benzothiazole compound as an etch refiner. The inventive composition and method is especially useful for manufacture of printed circuit boards having structural features of ≤100 μm.

13 Claims, No Drawings

COMPOSITION AND METHOD FOR MICRO ETCHING OF COPPER AND COPPER ALLOYS

The present application is a U.S. National Stage Application under 35 USC §371 of International Application No. PCT/EP2010/057243, filed 26 May 2010, published as WO 2011/147448 on 1 Dec. 2011, the entirety of which are incorporated herein by reference.

FIELD OF THE INVENTION

The invention relates to compositions and a method applying said compositions for micro etching of copper or copper alloys during manufacture of printed circuit boards.

BACKGROUND OF THE INVENTION

With increasing complexity of printed circuit board (PCB) geometry and the variety of copper and copper alloy substrates used in manufacture, good adhesion of imaging resists, e.g., photoresists, and solder masks has become a critical issue. Also due to more severe demands of lead-free production, it has become necessary to withstand the chemical attack of said copper or copper alloy surfaces caused by PCB surface finish processes like immersion tin, immersion silver and ENIG (electroless nickel/immersion gold). Therefore excellent adhesion of imaging resists or solder masks is now an essential prerequisite in order to prevent defects caused by poor imaging film or solder mask adhesion.

Increased adhesion of imaging resists or solder masks on copper or copper alloy surfaces can be archived by micro etching the copper or copper alloy surface prior to attachment of imaging resists or solder masks. One general type of compositions for said micro etching purpose is disclosed in EP 0 757 118. Such aqueous micro etching compositions comprise a cupric ion source, an organic acid and a source of halide ions.

Document EP 0 855 454 discloses a similar composition further comprising a polymer compound which contains polyamine chains or a cationic group or both.

The micro etching compositions for copper and copper alloy surfaces known from the prior art provide a uniform and controllable micro roughing of said surfaces but fail to provide a sufficient adhesion of imaging resists and solder masks as demanded for state of the art printed circuit board manufacturing. In particular, the adhesion provided by the above mentioned micro etching compositions for, e.g., solder mask spots with a size of ≤100 μm or fine line imaging resist patterns with line and space dimensions of ≤100 μm is not sufficient any more (see examples of the present invention).

Object of the Invention

Thus, it is the object of the present invention to provide compositions and methods useful for micro etching of copper and copper alloy surfaces in order to promote the adhesion of either imaging resists or solder masks on copper and copper alloy surfaces in the production of printed circuit boards.

DETAILED DESCRIPTION OF THE INVENTION

The micro etching composition providing good adhesion between a copper or copper alloy surface and an imaging resist or a solder mask is primarily composed of (i) at least one source of $Cu^{2+}$ ions,
(ii) at least one source of halide ions which are selected from fluoride, chloride and bromide,
(iii) at least one acid and,
(iv) at least one salt of an organic acid,
(v) and at least one etch refiner according to formula I

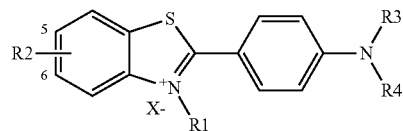

formula I wherein R1 is selected from the group consisting of hydrogen, $C_1$-$C_5$-alkyl or a substituted aryl or alkaryl group, R2 is selected from the group consisting of hydrogen, $C_1$-$C_5$-alkyl or $C_1$-$C_5$-alkoxy and attached in 5 or 6 position. R3 is selected from the group consisting of hydrogen and $C_1$-$C_5$-alkyl, R4 is selected from the group consisting of hydrogen and $C_1$-$C_5$-alkyl and wherein R3 and R 4 are identical. $X^-$ is a suitable anion selected from the group consisting of halogenide, pseudo-halogenide and methane sulfonate.

Preferably R1 is selected from the group consisting of hydrogen, methyl, ethyl, n-propyl, iso-propyl, phenyl and benzyl.

Preferably R2 is selected from the group consisting of hydrogen, methyl, ethyl, n-propyl and iso-propyl.

Preferably R3 and R4 are identical and selected from the group consisting of hydrogen, methyl, ethyl, n-propyl and iso-propyl.

More preferably R1 is selected from hydrogen and $C_1$-$C_2$-alkyl, aryl and alkaryl group.

More preferably R2 is selected from the group consisting of hydrogen, $C_1$-$C_2$-alkyl and $C_1$-$C_2$-alkoxy.

More preferably R3 and R4 are the identical and selected from the group consisting of hydrogen and $C_1$-$C_2$-alkyl.

Preferred etch refiner compounds are selected from the group consisting of 4-(6-methyl-1,3-benzothiazol-3-ium-2-yl)-N,N-dimethylaniline chloride, 4-(3-benzyl-6-methyl-1,3-benzothiazol-3-ium-2-yl-N,N-dimethylaniline chloride, 4-(3,6-dimethyl-1,3-benzothiazol-3-ium-2-yl)-N,N-dimethylaniline chloride, 4-(3-benzyl-5-methyl-1,3-benzothiazol-3-ium-2-yl)-N,N-dimethylaniline chloride, 4-(3,5-dimethyl-1,3-benzothiazol-3-ium-2-yl)-N,N-dimethylaniline chloride, 4-(3-methyl-6-ethoxy-1,3-benzothiazol-3-ium-2-yl)-N,N-dimethylaniline chloride, 4-(3-benzyl-1,3-benzothiazol-3-ium-2-yl)-N,N-dimethylaniline chloride, 4-(3-methyl-5-ethoxy-1,3-benzothiazol-3-ium-2-yl)-N,N-dimethylaniline chloride, 4-(3-benzyl-5-ethoxy-1,3-benzothiazol-3-ium-2-yl)-N,N-diemthylaniline chloride, 4-(3-benzyl-5-ethoxy-1,3-benzothiazol-3-ium-2-yl)-N,N-dimethylaniline chloride, 4-(6-methyl-1,3-benzothiazol-3-ium-2-yl)-N,N-diethylaniline chloride, 4-(3-benzyl-6-methyl-1,3-benzothiazol-3-ium-2-yl-N,N-diethylaniline chloride, 4-(3,6-dimethyl-1,3-benzothiazol-3-ium-2-yl)-N,N-diethylaniline chloride, 4-(3-benzyl-5-methyl-1,3-benzothiazol-3-ium-2-yl)-N,N-diethylaniline chloride, 4-(3,5-dimethyl-1,3-benzothiazol-3-ium-2-yl)-N,N-diethylaniline chloride, 4-(3-methyl-6-ethoxy-1,3-benzothiazol-3-ium-2-yl)-N,N-diethylaniline chloride, 4-(3-benzyl-1,3-benzothiazol-3-ium-2-yl)-N,N-diethylaniline chloride, 4-(3-methyl-5-ethoxy-1,3-benzothiazol-3-ium-2-yl)-N,N-diethylaniline chloride, 4-(3-benzyl-5-ethoxy-1,3-benzothiazol-3-ium-2- yl)-N,N-diethylaniline chloride, 4-(3-benzyl-5-ethoxy-1,3-benzothiazol-3-ium-2-yl)-N,N-diethylaniline chloride and mixtures thereof.

The concentration of the at least one etch refiner ranges from 0.01 to 100 mg/l, more preferred from 0.05 to 20 mg/l.

Suitable sources of copper ions are selected from the group comprising $CuCl_2$, Cu acetate, Cu formate, Cu tartrate, Cu carbonate, $CuBr_2$, CuO, $Cu(OH)_2$, $CuSO_4$, Cu methane sulfonate and mixtures thereof. The quantity of copper ions in the inventive composition ranges from 1 to 300 g/l, more preferred from 10 to 50 g/l and most preferred from 20 to 40 g/l.

The halide ions are selected from the group consisting of chloride, bromide and fluoride. Chloride is most preferred. The amount of halide ions added preferably ranges from 0.5 to 100 g/l, more preferred 1 to 20 g/l. The source of the halide ions is selected from the group consisting of NaF, KF, $NH_4F$, NaCl, KCl, $NH_4Cl$, NaBr, KBr, $NH_4Br$ and mixtures thereof.

The at least one acid present in the inventive composition is preferably an organic acid. The organic acid is preferably a carboxylic acid and is selected from mono-carboxylic acids, di-carboxylic acids, poly carboxylic acids and hydroxyl carboxylic acids. Even more preferred, the carboxylic acid is selected from the group, comprising formic acid, acetic acid, oxalic acid, tartaric acid, citric acid, gluconic acid and mixtures thereof. However, inorganic acids like HCl, $H_3PO_4$ and $H_2SO_4$ can substitute the organic acid or can be used in combination with the at least one organic acid. The total amount of acids present in the inventive composition ranges from 0.1 to 200 g/l, more preferred from 1 to 50 g/l.

The performance properties of the micro etching compositions disclosed in the present application can be increased, if a buffer system consisting of at least one organic acid and at least on salt of an organic acid are used. The salt of an organic acid is selected from the group consisting of sodium formate, sodium acetate, sodium gluconate, sodium oxalate, potassium-sodium tartrate, sodium citrate and mixtures thereof.

For example, a composition comprising formic acid as the organic acid and sodium formate as the corresponding salt reveals superior micro etching and adhesion properties. Suitable cations for salts of organic acids are selected from the group comprising sodium, potassium and ammonium. The overall concentration of the at least one salt of an organic acid present in the inventive composition ranges from 0.1 to 200 g/l, more preferred from 1 to 50 g/l.

In order to achieve a good buffer capacity the ratio of the acid to the salt should range between 10:1 to 1:1. Examples for buffer solutions comprise formic acid/sodium formate, tartaric acid/potassium-sodium tartrate, citric acid/sodium citrate, acetic acid/sodium acetate and oxalic acid/sodium oxalate, and mixtures thereof.

The buffer in combination with the etch refiner does not only influence the etch rate, but furthermore greatly enhances the surface roughness of the treated copper or copper alloy substrate. It is believed that the etch refiner compound adsorbs onto the copper surface, thus influencing the etch rate on a sub-micron scale. This causes the imparted roughness to be several times greater than without such an etch refiner. The etch refiner also directs the etching process to the copper or copper alloy grain boundaries, resulting in greatly increased etching on the boundaries compared to the etch rate away from these grain boundaries.

Imaging resists are photosensitive polymeric systems applied either as liquids or dry films. Solder masks are polymeric material deposits that provide a permanent protective coating for the copper or copper alloy surface of a PCB.

Further disclosed is a method for micro etching of copper or copper alloy surfaces using the above described composition in order to enhance the adhesion of an image resist or a solder mask to be attached to said surface.

The method according to this invention is carried out by contacting the copper or copper alloy surfaces with aforementioned compositions. The substrate can be immersed into the solution or the solution can be sprayed onto the copper or copper alloy surface of the substrate. For this purpose common horizontal or vertical equipment can be utilized.

Using a spray, the solution is sprayed onto the substrate having a copper or copper alloy surface at a pressure of 1-10 bar.

For both methods (spray or solution) the process is preferably carried out at a temperature of 20-60° C. The treatment time can vary between 15 and 300 s.

After the copper or copper alloy surface has been treated as such, the copper or copper alloy surfaces are rinsed with water, e.g., deionised water and then dried, e.g., with hot air.

Optionally, the etched copper or copper alloy surfaces can also be treated for 5-300 s with diluted acid after being rinsed, preferably with 10 vol.-% hydrochloric acid. After being treated with acid, the copper surfaces are again rinsed, preferably with deionised water.

The samples are preferably treated by spraying the etching compositions according to the invention onto the samples. The compositions can be sprayed in a vertical mode or horizontal mode, depending on the equipment desired. Alternatively, the samples can be immersed into the etching compositions. To achieve the same roughness values compared to spraying, the compositions need to be penetrated by oxygen, e.g., by bubbling air through them.

EXAMPLES

The invention will now be illustrated by reference to the following non-limiting examples.

The performance roughness values of copper surfaces micro etched with a composition according to the present invention and compositions known in the art were determined using an atomic force microscope. A copper clad laminate substrate (CCl) was used throughout experiments 1 to 3 and a substrate having a copper surface which was deposited with a direct current electrolytic copper process (DC) was used throughout experiments 4 to 6, respectively.

The process sequence used throughout experiments 1 to 6 was
1. cleaning of the copper surface (Softclean UC 181, a product of Atotech Deutschland GmbH, t=20 s, T=35° C.)
2. micro etching of the copper surface by spraying the micro etching compositions onto the copper substrates
3. contacting the micro etched copper surfaces with a 10 vol.-% hydrochloric acid solution for 15 s at 35° C.
4. drying of the micro etched copper surface
5. determining the copper surface roughness with an atomic force microscope (AFM)

The copper surface micro etch depth was adjusted to 1 μm in examples 1 to 6.

The resulting performance roughness values obtained from experiments 1 to 6 are summarized in table 1 (see below).

Examples 1 and 4 (Comparative)

A micro etching composition disclosed in EP 0 757 118 is contacted with both a CCl and a DC type substrate for 40 s at a temperature of 35° C. The micro etching composition consists of

| | |
|---|---|
| Cu-formate | 50 g/l |
| formic acid | 20 g/l |
| ammonium chloride | 80 g/l |

Example 2 and 5 (Comparative)

A micro etching composition disclosed as example 5 in EP 0 855 454 is contacted with both a CCl and a DC type substrate for 40 s at a temperature of 35° C. The micro etching composition consists of

| | |
|---|---|
| $CuCl_2$ | 40 g/l |
| HCl | 20 g/l |
| Lugalvan G 15000 (a product of BASF SE) | 0.02 g/l |

Example 3 and 6

A micro etching composition according to the present invention is contacted with both a CCl and a DC type substrate for 40 s at a temperature of 35° C. The micro etching composition consists of

| | |
|---|---|
| $CuCl_2$ | 55 g/l |
| NaCl | 41 g/l |
| formic acid | 28 g/l |
| Na-formate | 95 g/l |
| Na-gluconate | 10 g/l |
| 4-(3,6-dimethyl-1,3-benzothiazol-3-ium-2-yl)-N,N-dimethylaniline chloride | 10 mg/l |

Example 13 and 14

A micro etching composition according to the present invention is contacted with both a CCl and a DC type substrate for 15 s at a temperature of 30° C. The micro etching composition consists of

| | |
|---|---|
| $CuCl_2$ | 40 g/l |
| HCl (37%) | 20 ml/l |
| Na-formate | 20 g/l |
| NaCl | 30 g/l |
| 4-(3,6-dimethyl-1,3-benzothiazol-3-ium-2-yl)-N,N-dimethylaniline chloride | 10 mg/l |

TABLE 1 performance roughness values of copper surfaces obtained from examples 1 to 6 and 13, 14, respectively.

| Experiment no. | Substrate type | $R_a$* (nm) | RSAI (%) | $R_{max}$* (μm) |
|---|---|---|---|---|
| 1 | CCl | 278 | 57.0 | 1.9 |
| 2 | CCl | 297 | 84.9 | 2.0 |
| 3 (invention) | CCl | 322 | 119.6 | 2.0 |
| 4 | DC | 228 | 78.6 | 1.7 |
| 5 | DC | 331 | 97.2 | 2.2 |
| 6 (invention) | DC | 296 | 133.2 | 2.0 |
| 13 (invention) | CCl | 461 | 174.5 | 3.5 |
| 14 (invention) | DC | 291 | 146.9 | 2.4 |

*$R_a$ = arithmetic average of absolute values
**RSAI = relative surface area increase
***$R_{max}$ = maximum height between peak and valley The copper surface roughness representing parameters $R_a$, RSAI and $R_{max}$ obtained by atomic force microscopy show the highest values for the inventive compositions according to examples 3, 6, 13 and 14 compared to compositions known from prior art (examples 1, 2, 4 and 5).

The micro etching compositions used throughout examples 1 to 3 and 13, 14 are also used for adhesion performance tests wherein a solder mask (Elpemer SG 2467, a product of Peters) with dot sizes of 50 μm, 75 μm, 100 μm and 125 μm is attached to the micro etched copper surfaces. Again, CCl and DC type copper substrates are used. The adhesion performance is given in %-values of remaining solder mask dots before and after applying a tape test according to IPC-TM-650 from 8/97, revision D. The copper surface micro etch depth is adjusted to 1 μm throughout examples 7 to 12. The micro etch composition of example 1 is used for examples 7 and 10 and those of example 2 for example 8 and 11, and example 3 for examples 9 and 12, respectively. The micro etch composition of example 13 is used for examples 15 and 16. The results obtained from experiments 7 to 12 and 15, 16 are summarized in tables 2 to 5 (see below).

TABLE 2 results of the solder mask dot adhesion strength evaluation obtained from examples 7 to 12, solder mask dot size = 50 μm.

| Example no. | Substrate type | Remaining solder mask dots before tape test (%) | Remaining solder mask dots after tape test (%) |
|---|---|---|---|
| 7 | CCl | 0 | 0 |
| 8 | CCl | 5.1 | 0 |
| 9 (invention) | CCl | 100 | 100 |
| 10 | DC | 0 | 0 |
| 11 | DC | 30.1 | 0 |
| 12 (invention) | DC | 100 | 100 |
| 15 (invention) | CCl | 100 | 100 |
| 16 (invention) | DC | 100 | 100 |

The results from table 2 clearly show the superior adhesion of solder mask having a dot size of 50 μm on copper surfaces treated with a composition according to the present invention directly after rinsing the substrate (values of "remaining solder mask dots before tape test") and after rinsing and application of a tape test (values "remaining solder mask dots after tape test"). All solder mask dots having a size of 50 μm remain on the substrate treated with the inventive composition before and after the tape test. No solder mask dots remain on a substrate after tape test treated with the two compositions known from prior art.

TABLE 3 results of the solder mask dot adhesion strength evaluation obtained from examples 7 to 12 and 15, 16, solder mask dot size = 75 μm.

| Example no. | Substrate type | Remaining solder mask dots before tape test (%) | Remaining solder mask dots after tape test (%) |
|---|---|---|---|
| 7 | CCI | 0 | 0 |
| 8 | CCI | 93.8 | 0 |
| 9 (invention) | CCI | 100 | 100 |
| 10 | DC | 0 | 0 |
| 11 | DC | 99.9 | 0 |
| 12 (invention) | DC | 100 | 100 |
| 15 (invention) | CCI | 100 | 100 |
| 16 (invention) | DC | 100 | 100 |

The results from table 3 show that no solder mask dots having a size of 75 μm remain on substrate surfaces treated with one of the compositions known from prior art whereas all solder mask spots still adhere on substrate surfaces treated with a composition according to the present invention, even after a tape test.

TABLE 4 results of the solder mask dot adhesion strength evaluation obtained from examples 7 to 12 and 15 to 18, solder mask dot size = 100 μm.

| Example no. | Substrate type | Remaining solder mask dots before tape test (%) | Remaining solder mask dots after tape test (%) |
|---|---|---|---|
| 7 | CCI | 0 | 0 |
| 8 | CCI | 100 | 3.3 |
| 9 (invention) | CCI | 100 | 100 |
| 10 | DC | 0 | 0 |
| 11 | DC | 100 | 91.3 |
| 12 (invention) | DC | 100 | 100 |
| 15 (invention) | CCI | 100 | 100 |
| 16 (invention) | DC | 100 | 100 |

The results from table 4 show that the adhesion of solder mask dots having a size of 100 μm is in all cases (substrate material, after rinsing and after tape test) superior in case of the substrates treated with a composition according to the present invention.

TABLE 5 results of the solder mask dot adhesion strength evaluation obtained from examples 7 to 12 and 15, 16, solder mask dot size = 125 μm.

| Example no. | Substrate type | Remaining solder mask dots before tape test (%) | Remaining solder mask dots after tape test (%) |
|---|---|---|---|
| 7 | CCI | 0 | 0 |
| 8 | CCI | 100 | 75.7 |
| 9 (invention) | CCI | 100 | 100 |
| 10 | DC | 69.8 | 0 |
| 11 | DC | 100 | 100 |
| 12 (invention) | DC | 100 | 100 |
| 15 (invention) | CCI | 100 | 100 |
| 16 (invention) | DC | 100 | 100 |

The results summarized in table 5 for solder mask dots having a size of 125 μm also show the superior adhesion properties of substrates treated with a composition according to the present invention.

The results obtained from adhesion tests of solder mask dots on micro etched copper surfaces show a superior performance of the inventive micro etch composition (examples 9, 12 and 15, 16) compared to those of compositions known from prior art (examples 7, 8, 10 and 11). The superior solder mask adhesion performance of the inventive micro etch composition is obvious especially after applying a tape test and in general for solder mask dot sizes below 100 μm.

The invention claimed is:

1. A composition for micro etching of a copper or a copper alloy surface comprising
   i) at least one source of $Cu^{2+}$ ions,
   ii) at least one source of halide ions wherein the halide ions are selected from fluoride, chloride and bromide,
   iii) at least one acid,
   iv) at least one salt of an organic acid,
   v) and at least one etch refiner according to formula I

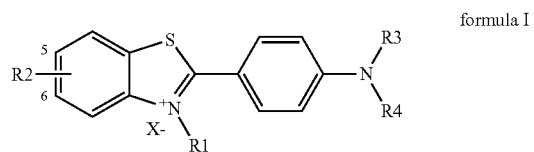

formula I wherein R1 is hydrogen, $C_1$-$C_5$-alkyl or a substituted aryl or alkaryl group;
R2 is in the 5 or 6 position and selected from the group consisting of hydrogen, $C_1$-$C_5$-alkyl and $C_1$-$C_5$-alkoxy;
R3 and R4 are the same and are selected from the group consisting of hydrogen and $C_1$-$C_5$-alkyl; and
$X^-$ is a suitable anion.

2. The composition according to claim 1, wherein
R1 is selected from the group consisting of hydrogen, methyl, ethyl, n-propyl, iso-propyl, phenyl and benzyl;
R2 is selected from the group consisting of hydrogen, methyl, ethyl, n-propyl and iso-propyl;
R3 and R4 are identical and selected from the group consisting of hydrogen, methyl, ethyl, n-propyl and iso-propyl.

3. The composition according to claim 1, wherein the etch refiner is selected from the group consisting of 4-(6-methyl-1,3-benzothiazol-3-ium-2-yl)-N,N-dimethylaniline chloride, 4-(3-benzyl-6-methyl-1,3-benzothiazol-3-ium-2-yl-N,N-dimethylaniline chloride, 4-(3,6-dimethyl-1,3-benzothiazol-3-ium-2-yl)-N,N-dimethylaniline chloride, 4-(3-benzyl-5-methyl-1,3-benzothiazol-3-ium-2-yl)-N,N-dimethylaniline chloride, 4-(3,5-dimethyl-1,3-benzothiazol-3-ium-2-yl)-N,N-dimethylaniline chloride, 4-(3-methyl-6-ethoxy-1,3-benzothiazol-3-ium-2-yl)-N,N-dimethylaniline chloride, 4-(3-benzyl-1,3-benzothiazol-3-ium-2-yl)-N,N-dimethylaniline chloride, 4-(3-methyl-5-ethoxy-1,3-benzothiazol-3-ium-2-yl)-N,N-dimethylaniline chloride, 4-(3-benzyl-5-ethoxy-1,3-benzothiazol-3-ium-2-yl)-N,N-diemthylaniline chloride, 4-(3-benzyl-5-ethoxy-1,3-benzothiazol-3-ium-2-yl)-N,N-dimethylaniline chloride, 4-(6-methyl-1,3-benzothiazol-3-ium-2-yl)-N,N-diethylaniline chloride, 4-(3-benzyl-6-methyl-1,3-benzothiazol-3-ium-2-yl-N,N-diethylaniline chloride, 4-(3,6-dimethyl-1,3-benzothiazol-3-ium-2-yl)-N,N-diethylaniline chloride, 4-(3-benzyl-5-methyl-1,3-benzothiazol-3-ium-2-yl)-N,N-diethylaniline chloride, 4-(3,5-dimethyl-1,3-benzothiazol-3-ium-2-yl)-N,N- diethylaniline chloride, 4-(3-methyl-6-ethoxy-1,3-benzothiazol-3-ium-2-yl)-N,N-diethylaniline chloride, 4-(3-benzyl-1,3-benzothiazol-3-ium-2-yl)-N,N-diethylaniline chloride, 4-(3-methyl-5-ethoxy-1,3-benzothiazol-3-ium-2-yl)-N,N-diethylaniline chloride, 4-(3-benzyl-5-ethoxy-1,3-benzothiazol-3-ium-2- yl)-N,N-diethylaniline chloride, 4-(3-benzyl-5-ethoxy-1,3-benzothiazol-3-ium-2-yl)-N,N-diethylaniline chloride and mixtures thereof.

4. The composition according to claim 1, wherein the at least one source of halide ions is selected from the group consisting of NaF, KF, $NH_4F$, NaCl, KCl, $NH_4Cl$, NaBr, KBr, $NH_4Br$ and mixtures thereof.

5. The composition according to claim 1, wherein the source of $Cu^{2+}$ ions is selected from the group consisting of $CuCl_2$, Cu acetate, Cu formate, Cu tartrate, Cu carbonate, $CuBr_2$, CuO, $Cu(OH)_2$, $CuSO_4$, Cu methane sulfonate and mixtures thereof.

6. The composition according to claim 1, wherein the at least one acid is selected from the group consisting of formic acid, acetic acid, oxalic acid, tartaric acid, citric acid, gluconic acid and mixtures thereof.

7. The composition according to claim 1 wherein the at least one acid is selected from the group consisting of HCl, $H_2SO_4$ and $H_3PO_4$ and mixtures thereof.

8. The composition according to claim 1, wherein the salt of an organic acid is selected from the group consisting of sodium formate, sodium acetate, sodium gluconate, sodium oxalate, potassium-sodium tartrate, sodium citrate and mixtures thereof.

9. The composition according to claim 1, wherein the at least one acid and the at least one salt of an organic acid are selected from the group consisting of formic acid/sodium formate, tartaric acid/potassium-sodium tartrate, citric acid/sodium citrate, acetic acid/sodium acetate and oxalic acid/sodium oxalate.

10. The composition according to claim 1, wherein the etch refiner concentration ranges from 0.01 to 100 mg/l.

11. The composition according to claim 1, wherein the etch refiner concentration ranges from 0.05 to 20 mg/l.

12. A method for micro etching of copper or copper alloy surfaces comprising the following steps:
  i) contacting said surface with a cleaner composition,
  ii) contacting said surface with a composition according to claim 1.

13. A method for micro etching of copper or copper alloy surfaces according to claim 12 further comprising the step:
  iii) contacting said surface with a post dip composition comprising hydrochloric acid.

* * * * *